United States Patent [19]

Hamano et al.

[11] Patent Number: 4,587,171
[45] Date of Patent: May 6, 1986

[54] PROCESS FOR FORMING PASSIVATION FILM ON PHOTOELECTRIC CONVERSION DEVICE AND THE DEVICE PRODUCED THEREBY

[75] Inventors: Toshihisa Hamano; Takeshi Nakamura; Mario Fuse, all of Ebina, Japan

[73] Assignee: Fuji Xerox Co., Ltd., Tokyo, Japan

[21] Appl. No.: 726,295

[22] Filed: Apr. 24, 1985

Related U.S. Application Data

[63] Continuation of Ser. No. 570,679, Jan. 13, 1984, abandoned.

[30] Foreign Application Priority Data

Feb. 3, 1983 [JP] Japan .................................. 58-16740

[51] Int. Cl.$^4$ ................................................ B32B 9/04
[52] U.S. Cl. ....................................... 428/448; 427/39; 427/74; 428/450; 428/457
[58] Field of Search ............................ 427/39, 74, 94; 428/448, 450, 457

[56] References Cited

U.S. PATENT DOCUMENTS

| | | | |
|---|---|---|---|
| 3,573,096 | 3/1971 | Tombs | 427/94 |
| 3,990,100 | 11/1976 | Mamine et al. | |
| 4,091,169 | 5/1978 | Bohg et al. | 427/94 X |
| 4,344,985 | 8/1982 | Goodman et al. | 427/95 |
| 4,379,943 | 4/1983 | Yang et al. | |
| 4,410,558 | 10/1983 | Izu et al. | |

FOREIGN PATENT DOCUMENTS 56-43776 4/1981 Japan .

*Primary Examiner*—Bernard D. Pianalto
*Attorney, Agent, or Firm*—Michael N. Meller

[57] ABSTRACT

In a process for forming a passivation film on the surface of a photoelectric conversion device having a junction between hydrogenated amorphous silicon and a conductive electrode, the passivation film is formed by the steps of forming a first passivation film of silicon oxide on the surface of the photoelectric conversion device and then forming a second passivation film of silicon nitride on the first passivation film. In this process, the first passivation film is formed under an atmosphere of a mixed gas prepared by mixing an excess of a gas containing oxygen with silane gas in accordance with the plasma CVD method.

6 Claims, 6 Drawing Figures

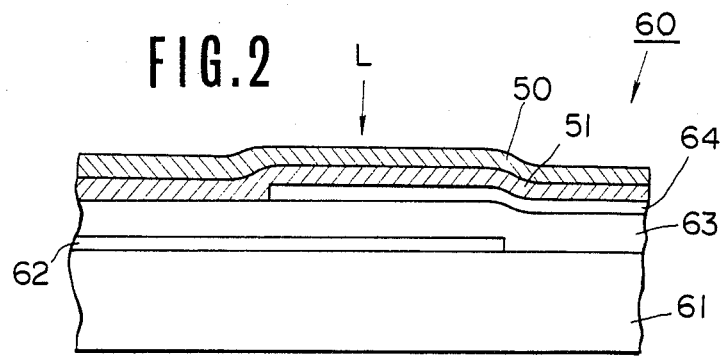
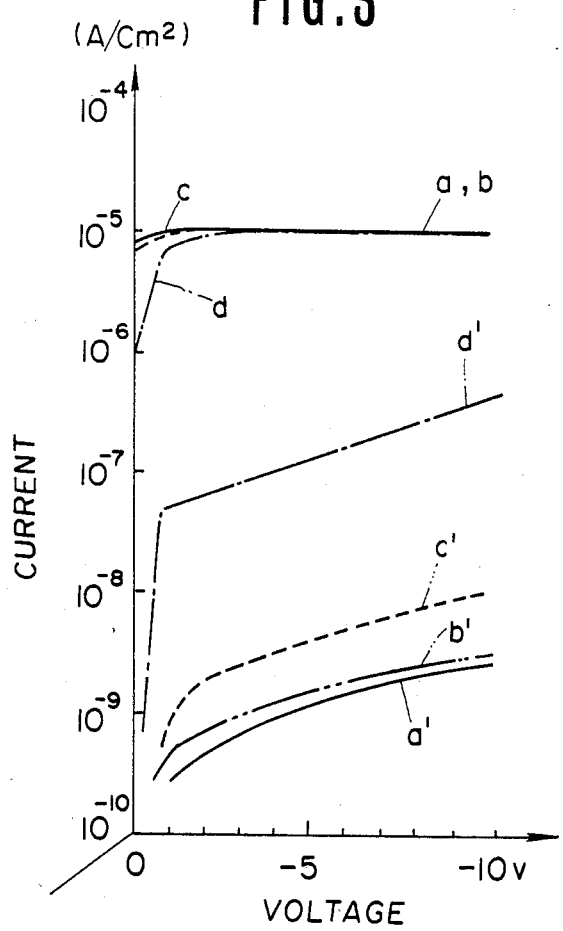

PROCESS FOR FORMING PASSIVATION FILM ON PHOTOELECTRIC CONVERSION DEVICE AND THE DEVICE PRODUCED THEREBY

This application is a continuation of application Ser. No. 570,679, filed Jan. 13, 1984, abandoned.

BACKGROUND OF THE INVENTION

1. Field of the Invention

This invention relates to a photoelectric conversion device, and particularly to a process for forming a passivation film on a photoelectric conversion device wherein hydrogenated amorphous silicon is employed as a photoconductor, and to the photoelectric conversion device produced by this process.

2. Description of the Prior Art

Of photoelectric conversion devices converting optical signals into electrical signals, there is known an image sensor for reading an original in a facsimile apparatus and the like.

FIGS. 1(a) and 1(b) are sectional views showing conventional planar type image sensors. The image sensor 10 of FIG. 1(a) has a construction wherein opaque electrodes 12 and 13 being opposed to each other are disposed on a substrate 11 with a suitable spacing, and a photoconductive material 14 and a passivation film 15 are successively laminated on the electrodes 12 and 13. Light is applied to the image sensor 10 from the side of the substrate 11 as indicated by an arrow La.

On the other hand, an image sensor 20 shown in FIG. 1(b) has a construction wherein a photoconductor 22 is formed on a substrate 21, opaque electrodes 23 and 24 being opposed to each other are disposed on the photoconductor 22 with a suitable spacing, and these electrodes 23 and 24 are further covered with a passivation film 25. Light is applied to the image sensor 20 from the side of the passivation film 25 (as indicated by an arrow Lb), contrary to the case of the image sensor 10 in FIG. 1(a).

FIGS. 1(c) and 1(d) are sectional views showing conventional sandwich type image sensors. The image sensor 30 of FIG. 1(c) has a construction wherein a transparent lower electrode 32 is formed on a substrate 31, a photoconductor 33 and an opaque upper electrode 34 are successively formed on the lower electrode 32, and a passivation film 35 is applied thereon. Light is applied to the image sensor 30 from the side of the substrate 31 as indicated by an arrow Lc in FIG. 1(c).

An image sensor 40 shown in FIG. 1(d) has a construction wherein an opaque lower electrode 42 is formed on a substrate 41, a photoconductor 43 and a transparent upper electrode 44 are successively formed on the substrate 41 and lower electrode 42, and a passivation film 45 is further applied thereon. In this case, light is applied to the image sensor 40 from the side of the passivation film 45 as indicated by an arrow Ld.

The substrate 11 in the image sensor 10 to which light is applied is transparent so that the substrate 11 functions also as the passivation film. Since the reverse passivation film 15 may be opaque, material and film thickness of the passivation film 15 can be selected comparatively tolerantly.

The image sensor 30 of sandwich construction is also in the same situation as that of the image sensor 10.

On the other hand, the passivation films 25 and 45 must be transparent in the image seensors 20 and 40 because light is applied from the sides of the passivation films.

Material for such passivation films may be phosphorous glass (PSG) prepared by the CVD (Chemical Vapor Deposition) method, and silicon nitride or silicon oxide prepared by the plasma CVD method, besides polyimide organic film and the like. Of the above materials, the most preferable is silicon nitride which is hardly permeable to water or an alkali ion such as Na and also, is heat resistive.

However, both silicon nitride utilized for the passivation film and amorphous silicon employed for the photoconductor have high residual stress, so that the silicon nitride film is likely to peel from the amorphous silicon film at the contacting portion therebetween. Such peeling becomes a cause for deterioration in the current-voltage characteristics of the photoelectric conversion device.

When a hydrogenated amorphous silicon film is heated at a temperature higher than 400° C., an elimination reaction of hydrogen from the silicon atom arises. For this reason, it is preferable that the hydrogenated amorphous silicon film not be heated at a temperature higher than 400° C. in the process of forming the passivation film. Accordingly, the most preferable method is the plasma CVD method in which low-temperature process treatment can be effected. The plasma CVD method, however, when it is intended for forming a silicon nitride film directly on a photoelectric conversion element, has the disadvantage that an ITO (indium-tin oxide) film changes in quality in the early stage of forming the silicon nitride film, and the characteristics of the junction between amorphous silicon and the ITO film deteriorate so that the dark current increases greatly.

SUMMARY OF THE INVENTION

Accordingly, it is an object of the present invention to provide a process for a forming passivation film on a photoelectric conversion device which does not deteriorate the photoelectric conversion characteristics even if a silicon nitride film is employed as passivation a film, as well as the photoelectric conversion device produced by this process.

According to the present invention, a silicon nitride film is not directly formed on a photoelectric conversion device, but a silicon oxide film is first formed on the photoelectric conversion device and then, the silicon nitride film is formed thereon.

Incidentally, when a silicon oxide film is formed on a photoelectric conversion device according to the plasma CVD method, since most reactive gases have a dissociation energy smaller than the ionization energy, the rate of formation of ions is slow among active seeds (radicals), causing positive ions to recombine with electrons and therefore many neutral radicals (hydrogen radicals) are generated in the plasma. Since active seeds other than ions have a long life, the hydrogen radical contained in silane gas reacts with ITO at the early stage of growth of the silicon oxide film in case of the film formation according to the plasma CVD method causing the change in the transparent upper electrode (ITO film). As a result the contacting portion between the transparent electrode and the hydrogenated amorphous silicon deteriorates, causing a a significant decrease in the light/dark current ratio due to the increase of the dark current.

Accordingly, in the present invention, a reactive gas containing a large amount of oxygen is mixed with a small amount of silane gas, and a silicon oxide film is first formed on the surface of a photoelectric conversion device in the resulting mixed gas atmosphere in accordance with the plasma CVD method.

The present invention provides a process for forming a passivation film on the surface of a photoelectric conversion device having a junction between the hydrogenated amorphous silicon and a conductive electrode, characterized in that the passivation film is formed by the steps of forming a first passivation film of silicon oxide on the surface of the photoelectric conversion device and then forming a second passivation film of silicon nitride on the first passivation film. In this process, the first passivation film is formed under an atmosphere of mixed gas prepared by mixing an excess of a gas containing oxygen with silane gas in accordance with the plasma CVD method.

Furthermore, the present invention provides a photoelectric conversion device having a junction between the hydrogenated amorphous silicon and a conductive electrode and a passivation film formed on the surface thereof, characterized in that the passivation film has a two-layer construction composed of a first passivation film of silicon oxide and a second passivation film of silicon nitride, both films being formed in accordance with the plasma CVD method.

BRIEF DESCRIPTION OF THE DRAWINGS

In the accompanying drawings:

FIG. 2 is a partial sectional view showing a photoelectric conversion device covered with a passivation film according to the present invention; and FIG. 3 is a graphical representation illustrating current-voltage characteristic curves of the photoelectric conversion device of FIG. 2.

DESCRIPTION OF THE PREFERRED EMBODIMENT

Figure 1A:
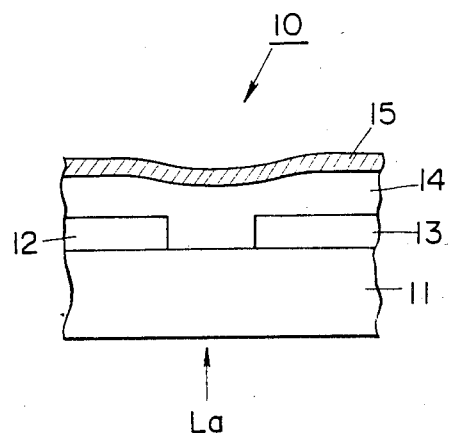
FIGS. 1(a) to 1(d) are partial sectional views showing various constructions of conventional image sensors.
Figure 1B:
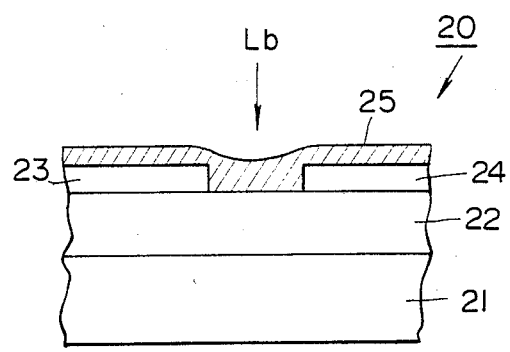
Figure 1C:
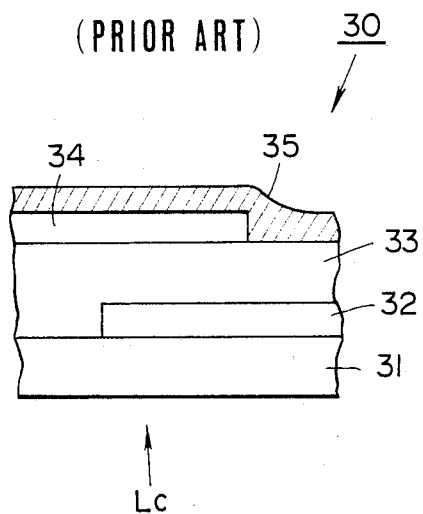
Figure 1D:
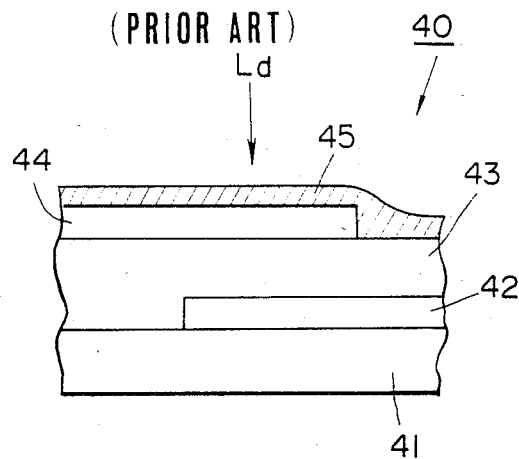

FIG. 2 is a sectional view showing a photoelectric conversion device 60 covered with a passivation film in accordance with the present invention.

As shown in FIG. 2, the photoelectric conversion device 60 is prepared by the steps of forming a lower electrode 62 on a glass or ceramic substrate 61, laminating successively amorphous silicon as a photoconductor 63 and a transparent upper electrode 64 on the lower electrode 62, and covering the whole surface of the resulting composite material, other than connecting terminals for the lower and upper terminals 62 and 64 (not shown), with a silicon nitride film 50. In addition, a silicon oxide film 51 is placed between the silicon nitride film 50 and the photoelectric conversion device 60 as a buffer film 51.

A process for forming a passivation film on the photoelectric conversion device according to the present invention will more specifically be described hereinbelow.

First, the lower electrode 62 of a suitable shape and size is provided by forming a chromium (Cr) film with a thickness of about 3000 Å all over the surface of the glass or brazed ceramic substrate 61 in accordance with the electron beam vapor deposition method, and further photoetching the resulting composite material to a desired shape and size. Then, silane (SiH4) gas is decomposed by means of glow discharge to deposit hydrogenated amorphous silicon on the substrate 61 with a thickness of about 1 μm, thereby forming the photoconductor 63. Next, the transparent upper electrode 64 is provided by forming a film of ITO (indium-tin oxide) with a thickness of about 1500 Å in accordance with a sputtering process.

Further a passivation film is provided on the photoelectric conversion device prepared in accordance with the process as mentioned above. The passivation film comprises the silicon oxide film 51 and the silicon nitride film 50 and was successively produced experimentally under the following conditions in accordance with the plasma CVD method.

The silicon oxide film 51 was fomred with a thickness of 3000 Å to 2.5 μm for about 1 hour under a substrate temperature of 250° C., vacuum degree of 0.1 to 1.5 Torr, discharge output of 50 to 250 W, silane gas flow rate of 3 to 20 SCCM (Standard cc minute), and dinitrogen monoxide flow rate of 100 to 500 SCCM. Then, the silicon nitride film 50 was formed with a thickness of 7000 to 9000 Å for about 20 minutes under a substrate temperature of 250° C., vacuum degree of 0.5 to 1.5 Torr, discharge output of 100 to 200 W, silane gas flow rate of 20 SCCM, ammonia flow rate of 60 SCCM, and nitrogen flow rate of 200 SCCM.

The photoelectric conversion device prepared as described above had very favorable properties with a photoelectric current of $10^{-7}$ A/cm$^2$.lux and a light/dark current ratio of about 7000. Furthermore, the photoelectric conversion device was subjected to the pressure Cook test for 1 hour at 120° C. and 2 atm of pressure. As a result no substantial changes were observed in its properties.

Now, the current-voltage characteristics of the photoelectric conversion device 60 with the silicon oxide film 51 as described above and covered with the silicon nitride film 50 will be described. In FIG. 3, curves a and a' represent light current and dark current when the photoelectric conversion device is covered with no passivation film (case I), curves b and b' represent light current and dark current when the photoelectric conversion device is covered with the passivation film according to the present invention (case II), curves c and c' represent light current and dark current when the photoelectric conversion device is only covered with a silicon oxide passivation film 51 as a buffer film (case III), and curves d and d' represent light current and dark current when the photoelectic conversion device is only covered with a silicon nitride passivation film 50 (case IV). As seen in FIG. 3, the light current has substantially the same value of $10^{-5}$ A/cm$^2$ in all cases, whilst the dark current increases in cases III and IV as compared with case I, and particularly in case IV it increases by substantially two powers. However, it is found that case II, where the photoelectric conversion element was covered with the passivation film according to the invention is substantially the same as case I, where the photoelectric conversion device was covered with no passivation film.

Further, although the passivation film has been described in connection with the above embodiment wherein the photoelectric conversion device is of a sandwich construction and light is applied from the opposite side of the substrate, this invention is of course not limited to the above case, but the passivation film may also be applied to a photoelectric conversion device of a planar construction.

The passivation film formed according to the present invention is also suited for use in other photoelectric conversion devices such as solar cell and the like.

In addition, the silicon nitride film and silicon nitride film can function as reflection preventive films by optimizing the thickness of each film, so that the refractive indices of the silicon oxide film and silicon nitride film become suitable values.

What is claimed is:

1. In a photoelectric conversion device having hydrogenated amorphous silicon between a transparent upper conductive electrode and a lower electrode on a substrate, a junction between said hydrogenated amorphous silicon and said electrically conductive electrode and covered with passivation film, the improvement comprising a first passivation film of silicon oxide formed by plasma chemical vapor deposition below 400° C. and a second passivation film of silicon nitride covering said first passivation film and formed by plasma chemical vapor deposition below 400° C., said photoelectric conversion device having a lower dark current value than a corresponding device having a passivation film of silicon oxide alone or of silicon nitride alone and having a light/dark current ratio substantially the same as a corresponding device having no passivation film.

2. A process for forming a passivation film on a photoelectric conversion device having hydrogenated amorphous silicon between a transparent upper conductive electrode and a lower electrode on a substrate, and a junction between said hydrogenated amorphous silicon and said upper transparent conductive electrode, comprising the steps of forming a first passivation film of silicon oxide on the surface of said photoelectric conversion device by plasma chemical vapor deposition at a substrate temperature of less than 400° C., and then forming a second passivation film of silicon nitride on said first passivation film by plasma chemical vapor deposition at a substrate temperature of less than 400° C. in order to provide a photoelectric conversion device having a lower dark current value than a device having a passivation film of silicon oxide alone or of silicon nitride alone and having a light/dark current ratio substantially the same as a corresponding device having no passivation film.

3. The process as claimed in claim 2, wherein the thickness of the silicon oxide film is from 3000 Å to 2.5 μm and the thickness of the silicon nitride film is from 4500 to 9000 Å.

4. The process as claimed in claim 2, wherein said second passivation film is formed under an atmosphere of a mixed gas prepared by mixing ammonia with silane gas plasma chemical vapor deposition.

5. The process as claimed in claim 2, wherein said conductive electrode is composed of indium-tin oxide.

6. A photoelectric conversion device passivated according to the process of claim 2, wherein the light-/dark current ratio is at least 1000.

* * * * *